(12) United States Patent
Kwak (10) Patent No.: US 7,554,125 B2  
(45) Date of Patent: Jun. 30, 2009

(54) MULTI-LAYER ELECTRODE AND COMPOUND SEMICONDUCTOR LIGHT EMITTING DEVICE COMPRISING THE SAME

(75) Inventor: Joon-seop Kwak, Gyeonggi-do (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/239,349

(22) Filed: Sep. 30, 2005

(65) Prior Publication Data

US 2006/0091405 A1 May 4, 2006

(30) Foreign Application Priority Data

Oct. 29, 2004  (KR) ...................... 10-2004-0087041

(51) Int. Cl.
*H01L 27/15* (2006.01)
(52) U.S. Cl. ............................................. 257/79
(58) Field of Classification Search ................. 257/79
See application file for complete search history.

(56) References Cited

U.S. PATENT DOCUMENTS 5,200,668 A * 4/1993 Ohashi et al. ................ 313/498

FOREIGN PATENT DOCUMENTS

KR         1995-111        1/1995

* cited by examiner

*Primary Examiner*—Long Pham
(74) *Attorney, Agent, or Firm*—Buchanan Ingersoll & Rooney PC (57) ABSTRACT

A multi-layer electrode and a compound semiconductor light emitting device comprising the same. A multi-layer electrode for the compound semiconductor light emitting device may be formed on a p-type compound semiconductor layer of the compound semiconductor light emitting device and may include: a first electrode layer formed on the p-type compound semiconductor layer which comprises a substance selected from the group consisting of a transparent conductive oxide, a non-conductive oxide, and a nitride; and a second electrode layer formed on the first electrode layer which comprises a substance selected from the group consisting of a transparent conductive oxide, a non-conductive oxide, and a nitride.

28 Claims, 4 Drawing Sheets

MULTI-LAYER ELECTRODE AND COMPOUND SEMICONDUCTOR LIGHT EMITTING DEVICE COMPRISING THE SAME

CROSS-REFERENCE TO RELATED PATENT APPLICATION

This application claims the benefit of Korean Patent Application No. 10-2004-0087041, filed on Oct. 29, 2004, in the Korean Intellectual Property Office, the disclosure of which is expressly incorporated herein in its entirety by reference.

BACKGROUND OF THE INVENTION

1. Field of the Invention

Embodiments of the present invention relate to a multi-layer electrode and a compound semiconductor light emitting device comprising the same, and more particularly, to a multi-layer electrode having low contact resistance, improved electrical conductivity, and especially, high light transmittance and a compound semiconductor light emitting device comprising the same.

2. Description of the Related Art

Compound semiconductor light emitting devices, for example, semiconductor laser diodes such as light emitting diodes (LEDs) and laser diodes (LDs), convert electric signals into optical signals using the characteristics of compound semiconductors. Laser beams of the compound semiconductor light emitting devices have been applied practically in the fields of optical communications, multiple communications, and space communications. Semiconductor lasers are widely used as light sources for data transmission or data recording and reading in the field of optical communications and such apparatuses as compact disk players (CDPs) or digital versatile disk players (DVDPs).

A compound semiconductor light emitting device can be categorized into a top-emitting light emitting diode (TLED) and a flip-chip light emitting diode (FCLED) according to the emission direction of light.

In the case of the FCLED, light emitted from an active layer is reflected by a reflective electrode formed on a p-type compound semiconductor layer, and the reflected light passes through a substrate.

The TLED emits light through a p-type electrode, which forms an ohmic contact with a p-type compound semiconductor layer. The p-type electrode may include a Ni layer and an Au layer, which are sequentially stacked on a p-type compound semiconductor layer. However, since the p-type electrode, formed of the Ni layer and the Au layer, is translucent, the TLED including the p-type electrode has low optical efficiency and low brightness.

To solve these problems, research on materials and structures for an electrode having low contact resistance and high light transmittance has been conducted.

OBJECTS AND SUMMARY

Embodiments of the present invention provide a multi-layer electrode having low contact resistance, improved electrical conductivity, and especially, high light transmittance and a compound semiconductor light emitting device comprising the same.

According to an aspect of embodiments of the present invention, there is provided a multi-layer electrode of a compound semiconductor light emitting device, which is formed on a p-type compound semiconductor layer of the compound semiconductor light emitting device, the multi-layer electrode including: a first electrode layer formed on the p-type compound semiconductor layer and made of a substance selected from the group consisting of a transparent conductive oxide, a non-conductive oxide, and a nitride; and a second electrode layer formed on the first electrode layer and made of a substance selected from the group consisting of a transparent conductive oxide, a non-conductive oxide, and a nitride.

According to another aspect of embodiments of the present invention, there is provided a compound semiconductor light emitting device comprising an n-type electrode, a p-type electrode, and, interposed between the n-type electrode and the p-type electrode, an n-type compound semiconductor layer, an active layer, and a p-type compound semiconductor layer, wherein the p-type electrode includes: a first electrode layer formed on the p-type compound semiconductor layer and made of a substance selected from the group consisting of a transparent conductive oxide, a non-conductive oxide, and a nitride; and a second electrode layer formed on the first electrode layer and made of a substance selected from the group consisting of a transparent conductive oxide, a non-conductive oxide, and a nitride.

The transparent conductive oxide may be an oxide of at least one element selected from the group consisting of In, Sn, Zn, Ga, Cd, Mg, Be, Ag, Mo, V, Cu, Ir, Rh, Ru, W, Co, Ni, Mn, and La, the non-conductive oxide is an oxide of at least one element selected from the group consisting of Si, Al, Zr, Ti, and Hf, and the nitride is a nitride of at least one element selected from the group consisting of Si, Al, Zr, Ti, and Mo.

Preferably each of the first electrode layer and the second electrode layer may have such a thickness that it has a reflectance of 2% or less for light generated from the active layer.

The compound semiconductor light emitting device may further include at least one electrode layer which is formed on the second electrode layer and made of a substance selected from the group consisting of a transparent conductive oxide, a non-conductive oxide, and a nitride.

The compound semiconductor light emitting device may further include an ohmic contact layer which is interposed between the p-type compound semiconductor layer and the first electrode layer and made of a substance selected from the group consisting of Ag, an Ag-based alloy, a Zn-based alloy, a Ni-based alloy, a La-based alloy, a Mg-based alloy, indium oxide containing an additive element, and $SnO_2$ containing an additive element. The additive element may be at least one selected from the group consisting of Mg, Ag, Zn, Sc, Hf, Zr, Te, Se, Ta, W, Nb, Cu, Si, Ni, Co, Mo, Cr, Mn, Hg, Pr, Sb, and La. A concentration of the additive element added to the indium oxide and $SnO_2$ may be 0.001-49 atomic %. The ohmic contact layer may have a thickness of 0.1-500 nm.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE INVENTION

Hereinafter, a multi-layer electrode and a compound semiconductor light emitting device comprising the multi-layer electrode will be described in more detail with reference to the attached drawings.

Figure 1:
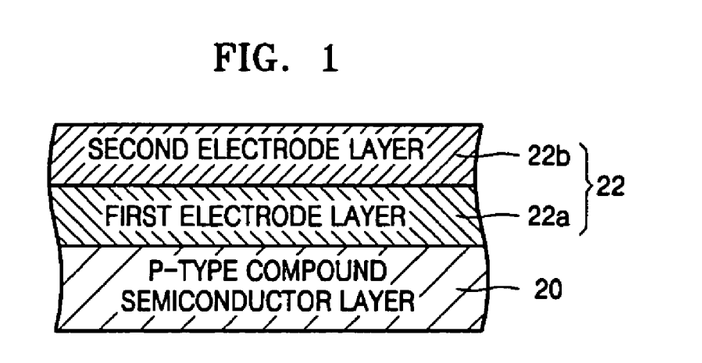
FIG. 1 is a cross-sectional view of a multi-layer electrode according to an embodiment of the present invention.

FIG. 1 is a cross-sectional view of a multi-layer electrode 22 according to an embodiment of the present invention.

Referring to FIG. 1, the multi-layer electrode 22 is formed on a top surface of a p-type compound semiconductor layer 20. The multi-layer electrode 22 comprises a first electrode layer 22a and a second electrode layer 22b sequentially formed on the top surface of the p-type compound semiconductor layer 20.

The first electrode layer 22a and the second electrode layer 22b are, independently, made of a substance selected from the group consisting of a transparent conductive oxide, a non-conductive oxide, and a nitride.

The transparent conductive oxide may be an oxide of at least one element selected from the group consisting of In, Sn, Zn, Ga, Cd, Mg, Be, Ag, Mo, V, Cu, Ir, Rh, Ru, W, Co, Ni, Mn, and La. The non-conductive oxide may be an oxide of at least one element selected from the group consisting of Si, Al, Zr, Ti, and Hf. The nitride may be a nitride of at least one element selected from the group consisting of Si, Al, Zr, Ti, and Mo.

Each of the first electrode layer 22a and the second electrode layer 22b preferably has a thickness so that it has a reflectance of 2% or less for light generated from the compound semiconductor light emitting device. The thicknesses of the first electrode layer 22a and the second electrode layer 22b are preferably such thicknesses that each has a reflectance of 2% or less. The minimum reflectance can be obtained from equations 1 and 2, respectively.

$$d_1 = \left[\frac{\lambda}{2\pi n_1}\arctan(F_1)\right], \left[\frac{\lambda}{2\pi n_1}[\pi - \arctan(F_1)]\right] \quad \text{Equation 1}$$

$$F_1 = n_1\sqrt{\frac{(n_{sub} - n_0)(n_2^2 - n_0 n_{sub})}{(n_1^2 n_{sub} - n_0 n_2^2)(n_0 n_{sub} - n_1^2)}}$$

$$d_2 = \left[\frac{\lambda}{2\pi n_2}\arctan(F_2)\right], \left[\frac{\lambda}{2\pi n_2}[\pi - \arctan(F_2)]\right] \quad \text{Equation 2}$$

$$F_2 = n_2\sqrt{\frac{(n_{sub} - n_0)(n_0 n_{sub} - n_1^2)}{(n_1^2 n_{sub} - n_0 n_2^2)(n_2^2 - n_0 n_{sub})}}$$

wherein $d_1$ and $d_2$ represent thicknesses of the first electrode layer 22a and the second electrode layer 22b, respectively;

$n_1$ and $n_2$ represent reflective indexes of materials constituting the first electrode layer 22a and the second electrode layer 22b, respectively;

$\lambda$ represents a wavelength of light transmitting the relevant electrode layer;

$n_0$ represents a refractive index of air;

$n_{sub}$ represents a refractive index of the p-type compound semiconductor layer 20 contacting the first electrode layer 22a; and $F_1$ and $F_2$ represent substitution functions, respectively.

The first electrode layer 22a and the second electrode layer 22b may be formed by a method using an e-beam & thermal evaporator, a dual-type thermal evaporator, etc., or using physical vapor deposition (PVD), chemical vapor deposition (CVD), plasma laser deposition (PLD), etc. The deposition temperature may be 20-1500° C. and a pressure in a reactor may be from atmospheric pressure to $10^{-12}$ torr.

After the formation of the second electrode layer 22b, the resultant structure may be annealed. Specifically, the resultant structure is annealed in a gas atmosphere containing at least one selected from the group consisting of nitrogen, argon, helium, oxygen, hydrogen, and air. The annealing may be performed at 200-700° C. for 10 seconds to 2 hours.

Each of the first electrode layer 22a and the second electrode layer 22b may have a thickness that provides a minimum reflectance, and thus, the reflectance of the multi-layer electrode 22 may be minimized, allowing for high light transmittance.

Figure 2:
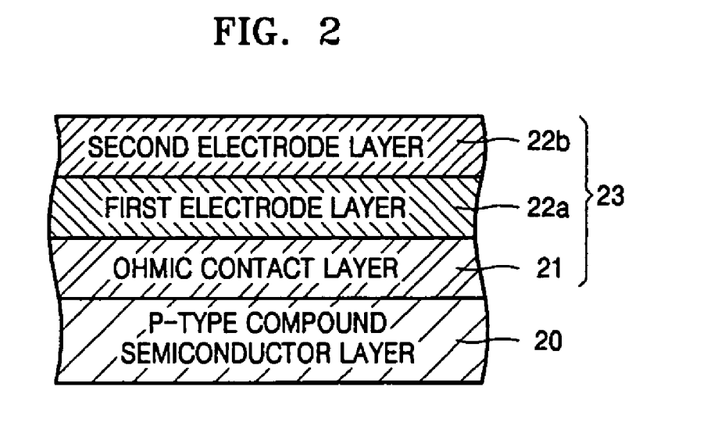
FIG. 2 is a cross-sectional view of a multi-layer electrode according to an embodiment of the present invention.

FIG. 2 is a cross-sectional view of a multi-layer electrode 23 according to another embodiment of the present invention.

In the embodiment of FIG. 2, portions different from those in the previous embodiment illustrated in FIG. 1 will be explained. Like reference numerals in the drawings denote like elements.

Referring to FIG. 2, the multi-layer electrode 23 comprises an ohmic contact layer 21, a first electrode layer 22a and a second electrode layer 22b sequentially formed on a top surface of a p-type compound semiconductor layer 20. The multi-layer electrode 23 according to the present embodiment is different from the multi-layer electrode 22 according to the embodiment illustrated in FIG. 1 in that it further comprises the ohmic contact layer 21 between the p-type compound semiconductor layer 20 and the first electrode layer 22a.

The ohmic contact layer 21 forms an ohmic contact with the p-type compound semiconductor layer 20 and may have low contact resistance. The ohmic contact layer 21 may be made of a substance selected from the group consisting of Ag, an Ag-based alloy, a Zn-based alloy, a Ni-based alloy, a La-based alloy, a Mg-based alloy, indium oxide containing an additive element, and SnO₂ containing an additive element. The additive element may be at least one selected from the group consisting of Mg, Ag, Zn, Sc, Hf, Zr, Te, Se, Ta, W, Nb, Cu, Si, Ni, Co, Mo, Cr, Mn, Hg, Pr, Sb, and La. The ohmic contact layer 21 may have a thickness of 0.1-500 nm.

The additive element controls a band gap, electron affinity, and work function of the indium oxide and SnO₂, thereby improving an ohmic contact property of the ohmic contact layer 21. Specifically, the additive element increases an effective carrier concentration of the p-type compound semiconductor layer 20 and is highly reactive to chemical components constituting the p-type compound semiconductor layer 20, except nitrogen.

For example, when the p-type compound semiconductor layer 20 is made of a GaN-based compound, the additive element may readily react with gallium (Ga) rather than with nitrogen (N). In this case, the additive element reacts with Ga of the p-type compound semiconductor layer 20, thus generating Ga vacancies in a surface of the p-type compound semiconductor layer 20. The Ga vacancies function as a p-type dopant and the effective carrier concentration on the surface of p-type compound semiconductor layer 20 increases.

The indium oxide to which the additive element is added reacts with a $Ga_2O_3$ layer which is a natural oxide layer that remains on the p-type compound semiconductor layer 20. The $Ga_2O_3$ layer obstructs a flow of the carriers at an interface between the p-type compound semiconductor layer 20 and the ohmic contact layer 21. As a result of the reaction with the $Ga_2O_3$ layer, a transparent conductive oxide is generated at the interface between the p-type compound semiconductor layer 20 and the ohmic contact layer 21. The transparent conductive oxide induces a tunneling conduction phenomenon at the above interface, thus improving the ohmic contact characteristic of the ohmic contact layer 21. As a result, the multi-layer electrode 23 further comprising the ohmic contact layer 21 may have low contact resistance and improved electrical conductivity.

A concentration of the additive element added to the indium oxide and $SnO_2$, respectively, may be 0.001-49 atomic %. As used herein, the term "atomic %" refers to the number of atoms of an element per unit volume divided by the number of atoms per unit volume of the substance containing the element.

The ohmic contact layer 21 can be formed by a method using an e-beam & thermal evaporator, a dual-type thermal evaporator, etc., or using PVD, CVD, PLD, etc. The deposition temperature may be 20-1500° C. and a pressure in a reactor may be from atmospheric pressure to $10^{-12}$ torr.

After the formation of the ohmic contact layer 21, the resultant structure may be annealed. The annealing may be performed as in the annealing of the first electrode layer 22a and the second electrode layer 22b in the embodiment illustrated in FIG. 1.

Figure 3:
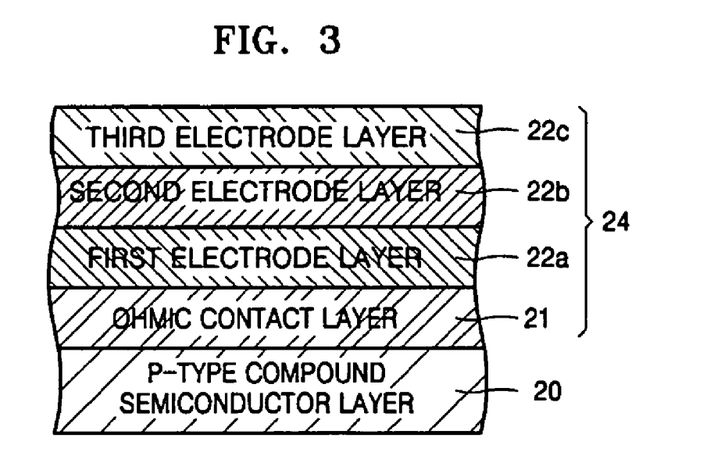
FIG. 3 is a cross-sectional view of a multi-layer electrode according to an embodiment of the present invention.

FIG. 3 is a cross-sectional view of a multi-layer electrode 24 according to an embodiment of the present invention.

In the embodiment of FIG. 3, portions different from those in the previous embodiment illustrated in FIG. 2 will be explained. Like reference numerals in the drawings denote like elements.

Referring to FIG. 3, the multi-layer electrode 24 further comprises a third electrode layer 22c on the second electrode layer 22b of the multi-layer electrode 23 illustrated in FIG. 2.

The third electrode layer 22c may be made of a substance selected from the group consisting of a transparent conductive oxide, a non-conductive oxide, and a nitride. The third electrode layer 22c may have such a thickness that it has a reflectance of 2% or less for light generated from the compound semiconductor light emitting device.

The third electrode layer 22c may be formed using the same method of forming the first electrode layer 22a and the second electrode layer 22b in the embodiment illustrated in FIG. 2. After the formation of the third electrode layer 22c, a process of annealing the resultant structure may be further performed. The annealing may be performed as in the annealing of the first electrode layer 22a and the second electrode layer 22b in the embodiment illustrated in FIG. 1.

The multi-layer electrode 24 according to the embodiment illustrated in FIG. 3 comprises an ohmic contact layer 21, and thus, may have low contact resistance and improved electrical conductivity. Especially, each of the first electrode layer 22a, the second electrode layer 22b, and the third electrode layer 22c may have a thickness that provides a minimum reflectance, and thus, the reflectance of the multi-layer electrode 24 may be minimized, allowing for high light transmittance.

The multi-layer electrode 24 may further comprise at least one electrode layer (not shown), for example, a fourth electrode layer, a fifth electrode layer, etc. formed on a top surface of the third electrode layer 22c. The at least one electrode layer may be made of a substance selected from the group consisting of a transparent conductive oxide, a non-conductive oxide, and a nitride. Each of the at least one electrode layer may have such a thickness that it has a reflectance of 2% or less, preferably the minimum reflectance.

Figure 4:
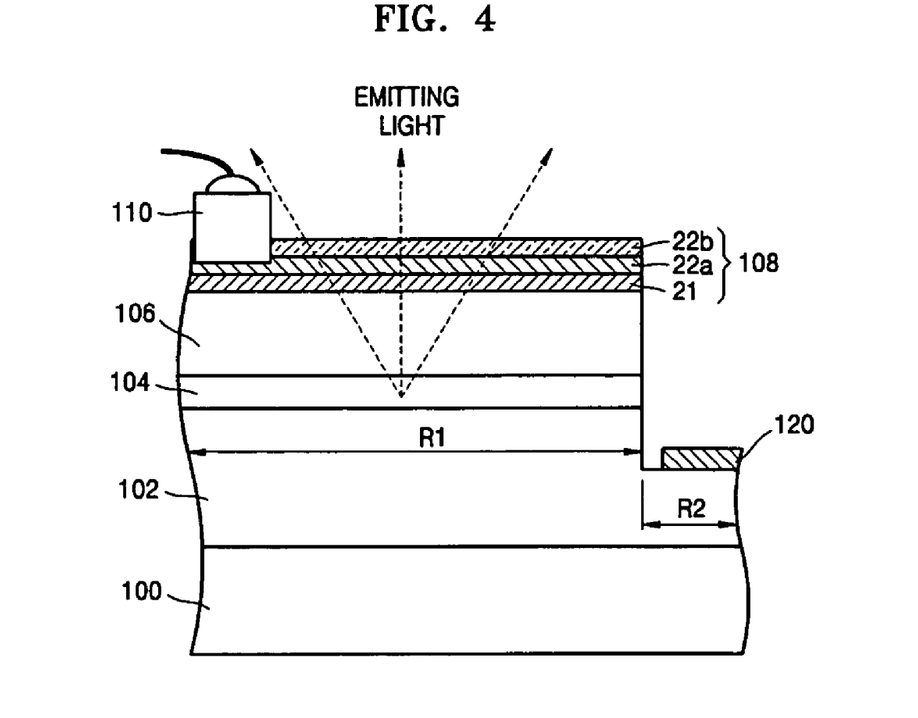
FIG. 4 is a cross-sectional view of a compound semiconductor light emitting device comprising a multi-layer electrode illustrated in FIG. 2.

FIG. 4 is a cross-sectional view of a compound semiconductor light emitting device comprising a multi-layer electrode as illustrated in FIG. 2. Detailed descriptions of the constitutional elements explained in FIG. 2 will be not repeated. Like reference numerals in the drawings denote like elements.

Referring to FIG. 4, the compound semiconductor light emitting device comprises an n-type electrode 120, a p-type electrode 108, and at least an n-type compound semiconductor layer 102, an active layer 104, and a p-type compound semiconductor layer 106, which are interposed between the n-type electrode 120 and the p-type electrode 108. The multi-layer electrode 23 illustrated in FIG. 2 is used as the p-type electrode 108. That is, the p-type electrode 108 comprises the ohmic contact layer 21, the first electrode layer 22a, and the second electrode layer 22b. The first electrode layer 22a and the second electrode layer 22b may be, independently, made of a transparent conductive oxide and a non-conductive oxide. The p-type electrode 108 is connected to a bonding layer 110. For this, a portion of the second electrode layer 22b is etched to expose a portion of the first electrode layer 22a, and thus, the bonding layer 110 can contact the first electrode layer 22a which is conductive. The bonding layer 110 is made of a conductive material, such as gold (Au).

The n-type compound semiconductor layer 102 includes a first compound semiconductor layer as a lower contact layer, which is stacked on a top surface of a substrate 100 and has a step difference, and a lower clad layer stacked on a surface of the first compound semiconductor layer. The n-type lower electrode 120 is disposed in a lower stepped portion of the first compound semiconductor layer.

The substrate 100 may be a sapphire substrate or a free-standing GaN substrate. The first compound semiconductor layer may include, but is not limited to, an n-GaN-based III-V group nitride compound semiconductor layer, preferably, an n-GaN layer. The first compound semiconductor layer may also be a layer made of any other III-V group compound semiconductor that allows for laser oscillation (lasing). The lower clad layer may be an n-GaN/AlGaN layer having a predetermined refractive index, but it is possible to use any other compound semiconductor layer that allows for lasing.

The active layer 104 may be made of any material that allows for lasing, preferably, a material that can oscillate laser beams having a low critical current and a stable transverse mode characteristic. The active layer 104 may be a GaN-based III-V group nitride compound semiconductor layer, which is represented by $In_xAl_yGa_{1-x-y}N$, wherein $0 \leq x \leq 1$, $0 \leq y \leq 1$, and $x+y \leq 1$. The active layer 104 may have one of a multiple quantum well structure and a single quantum well structure, and the technical scope of embodiments of the present invention is not limited by the structure of the active layer 104.

An upper waveguide layer and a lower waveguide layer may be further formed on and under the active layer 104, respectively. The upper and lower waveguide layers may be made of a material having a lower refractive index than the active layer 104, preferably, a GaN-based III-V group compound semiconductor. The lower waveguide layer may be an n-GaN layer, while the upper waveguide layer may be a p-GaN layer.

The p-type compound semiconductor layer 106 is stacked on the active layer 104 and may comprise an upper clad layer, which may have a lower refractive index than the active layer 104, and a second compound semiconductor layer, which may be an ohmic contact layer stacked on the upper clad layer. The second compound semiconductor layer may include, but is not limited to, a p-GaN-based III-V group nitride compound semiconductor layer, preferably, a p-GaN layer. The second compound semiconductor layer may also be a layer made of any other III-V group compound semiconductor layer that allows for laser oscillation (lasing). The upper clad layer may be a p-GaN/AlGaN layer having a predetermined refractive index, but it is possible to use any other compound semiconductor layer that allows for lasing.

The n-type electrode 120 may be disposed on the stepped portion of the first compound semiconductor layer, which is a lower ohmic contact layer. Alternatively, the n-type electrode 120 may be formed opposite to the p-type electrode 108 on a bottom surface of the substrate 100. In this case, the substrate 100 may be made of silicon carbide (SiC) or GaN.

The compound semiconductor light emitting device comprising the multi-layer electrode 108 may have an excellent current-voltage characteristic and may have high light transmittance in its electrodes, thus improving optical ouput and luminous efficiency.

Figure 5:
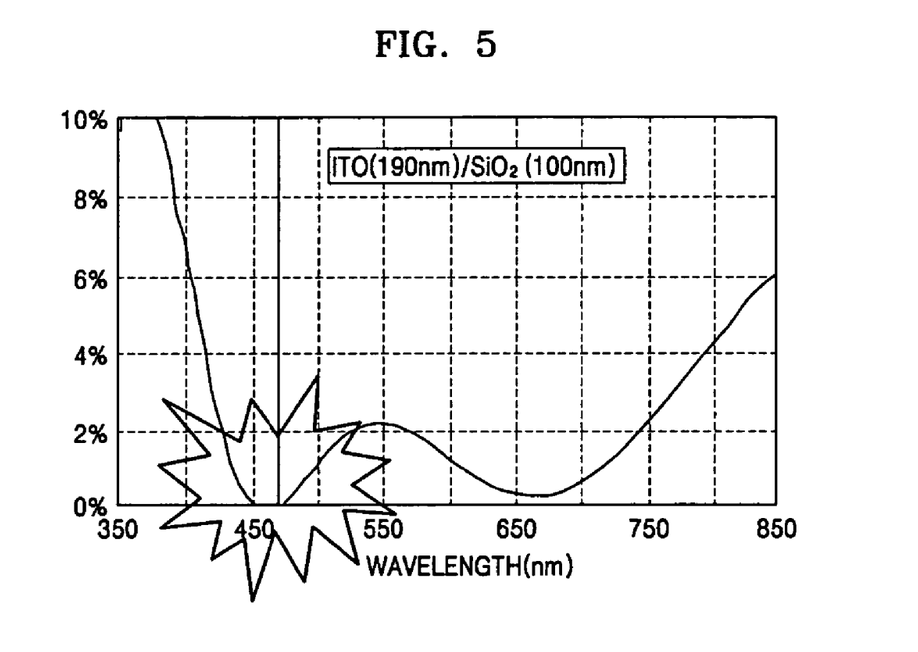
FIG. 5 is a graph showing a light reflectance of a multi-layer electrode (ITO/SiO₂) according to an exemplary embodiment of the present invention.

FIG. 5 is a graph showing a light reflectance of a multi-layer electrode (ITO/SiO$_2$) according to an exemplary embodiment of the present invention.

In the multi-layer electrode (ITO/SiO$_2$), a first electrode layer is made of indium tin oxide (ITO) and has a thickness of 190 nm and a second electrode layer is made of SiO$_2$ and has a thickness of 100 nm. ITO has a refractive index ($n_1$) of 2.058 and an extinction coefficient ($k_1$) of 0.04. SiO$_2$ has a refractive index ($n_2$) of 1.47 and an extinction coefficient ($k_2$) of 0. Referring to FIG. 5, a refractive index of the multi-layer electrode (ITO/SiO$_2$) is near 0 at a wavelength of 470 nm. Thus, the multi-layer electrode has high light transmittance.

Figure 6:
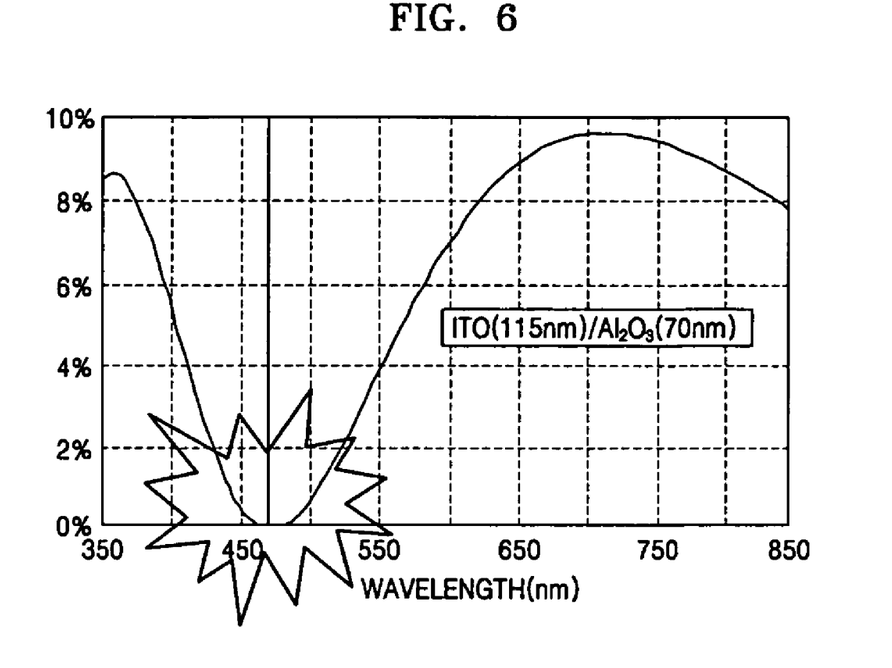
FIG. 6 is a graph showing a light reflectance of a multi-layer electrode (ITO/Al₂O₃) according to another exemplary embodiment of the present invention.

FIG. 6 is a graph showing a light reflectance of a multi-layer electrode (ITO/Al$_2$O$_3$) according to another exemplary embodiment of the present invention. In the multi-layer electrode (ITO/Al$_2$O$_3$), a first electrode layer is made of ITO and has a thickness of 115 nm and a second electrode layer is made of Al$_2$O$_3$ and has a thickness of 70 nm. ITO has a refractive index ($n_1$) of 2.058 and an extinction coefficient ($k_1$) of 0.04. Al$_2$O$_3$ has a refractive index ($n_2$) of 1.684 and an extinction coefficient ($k_2$) of 0. Referring to FIG. 6, a refractive index of the multi-layer electrode (ITO/Al$_2$O$_3$) is near 0 at a wavelength of 470 nm. Thus, the multi-layer electrode (ITO/Al$_2$O$_3$) has high light transmittance.

Figure 7:
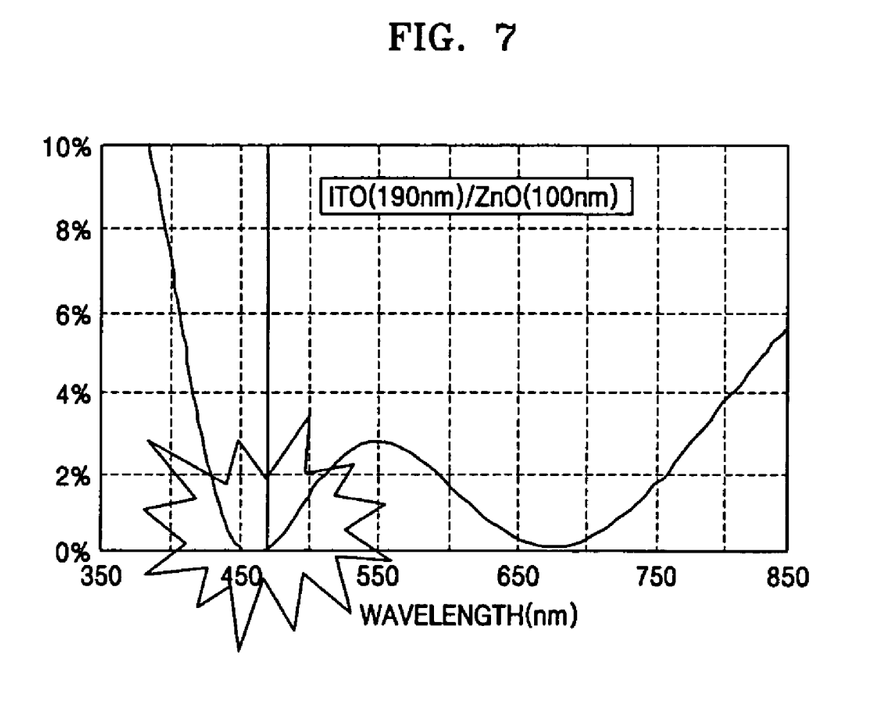
FIG. 7 is a graph showing a light reflectance of a multi-layer electrode (ITO/ZnO) according to still another exemplary embodiment of the present invention.

FIG. 7 is a graph showing a light reflectance of a multi-layer electrode (ITO/ZnO) according to still another exemplary embodiment of the present invention.

In the multi-layer electrode (ITO/ZnO), a first electrode layer is made of ITO and has a thickness of 190 nm and a second electrode layer is made of ZnO and has a thickness of 100 nm. ITO has a refractive index ($n_1$) of 2.058 and an extinction coefficient ($k_1$) of 0.04. ZnO has a refractive index ($n_2$) of 1.5 and an extinction coefficient ($k_2$) of 0. Referring to FIG. 7, a refractive index of the multi-layer electrode (ITO/ZnO) is near 0 at a wavelength of 470 nm. Thus, the multi-layer electrode (ITO/ZnO) has high light transmittance.

Figure 8:
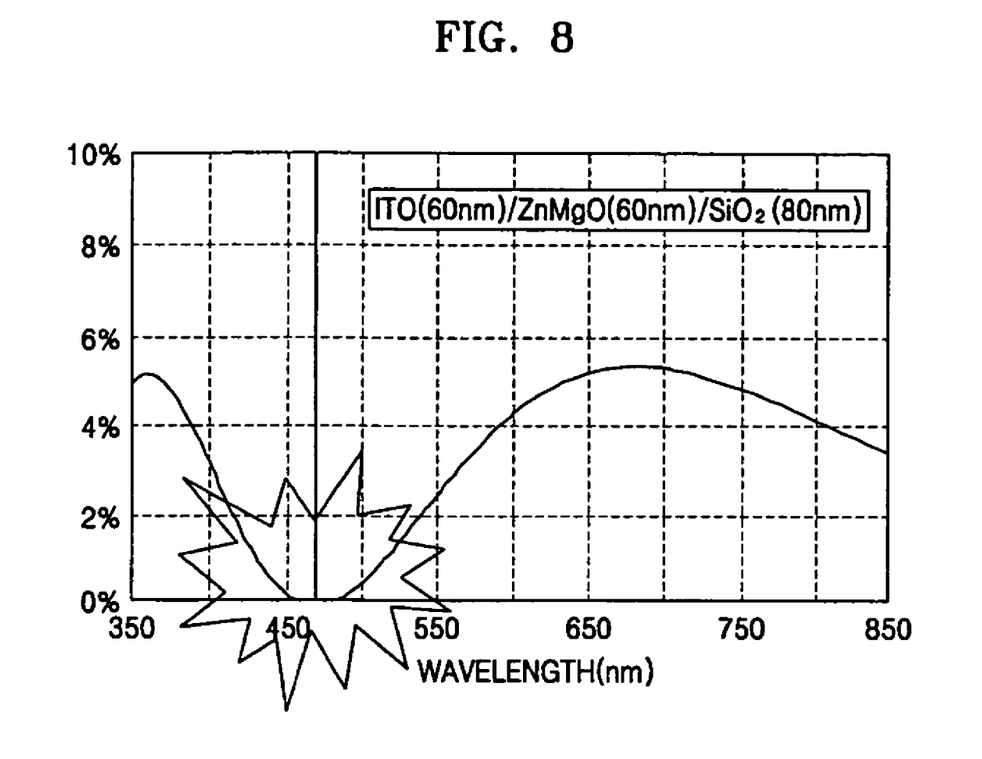
FIG. 8 is a graph showing a light reflectance of a multi-layer electrode (ITO/ZnMgO/SiO₂) according to yet another exemplary embodiment of the present invention.

FIG. 8 is a graph showing a light reflectance of a multi-layer electrode (ITO/ZnMgO/SiO$_2$) according to yet another exemplary embodiment of the present invention.

In the multi-layer electrode (ITO/ZnMgO/SiO$_2$), a first electrode layer is made of ITO and has a thickness of 60 nm, a second electrode layer is made of ZnMgO and has a thickness of 60 nm, and a third electrode layer is made of SiO$_2$ and has a thickness of 80 nm. ITO has a refractive index ($n_1$) of 2.058 and an extinction coefficient ($k_1$) of 0.04. ZnMgO has a refractive index ($n_2$) of 1.9 and an extinction coefficient ($k_2$) of 0. SiO$_2$ has a refractive index ($n_3$) of 1.47 and an extinction coefficient ($k_3$) of 0. Referring to FIG. 7, a refractive index of the multi-layer electrode (ITO/ZnMgO/SiO$_2$) is near 0 at a wavelength of 470 nm. Thus, the multi-layer electrode (ITO/ZnMgO/SiO$_2$) has high light transmittance.

EXAMPLE

Hereinafter, a multi-layer electrode according to an embodiment of the present invention will be described in more detail with reference to the following example. However, this example is given for the purpose of illustration and is not intended to limit the true technical scope of the invention.

First, a structure of a p-type compound semiconductor layer containing GaN as a primary component formed on a substrate was surface-washed with trichloroethylene, acetone, methanol, and distilled water, respectively, for 5 minutes in an ultrasonic bath at 60° C., and then, hard-baked at 100° C. for 10 minutes to remove a residual water.

Next, a photoresist was spin-coated on the p-type compound semiconductor layer at 4,500 rpm. The resultant structure was soft-baked at 85° C. for 15 minutes, and then, a mask was aligned with the structure and exposed to UV light at an intensity of 22.8 mW for 15 seconds. The resultant structure was developed by dipping it into a mixed solution of a developer and distilled water in a mixing ratio of 1:4 for about 25 minutes.

Subsequently, the developed structure was dipped in a buffered oxide etchant (BOE) solution for 5 minutes to remove a contamination layer from the developed structure. Then, ITO was deposited on the resultant structure using an electron-beam evaporator to form a first electrode layer.

A second electrode layer of ZnO was deposited on the first electrode layer and subjected to a lift-off process using acetone, and then, the resultant product was annealed at 430-530° C. for 1 minute under an oxygen or a nitrogen atmosphere in a rapid thermal annealing (RTA) furnace.

The above method can be applied to a method of manufacturing a light emitting device as illustrated in FIG. 4.

A multi-layer electrode according to an embodiment of the present invention has low contact resistance and improved electrical conductivity, and especially, has a minimum reflectance, thus obtaining high light transmittance.

A compound semiconductor light emitting device comprising the multi-layer electrode according to an embodiment of the present invention has excellent current-voltage characteristic and has high light transmittance in its electrodes, thus improving optical ouput and luminous efficiency.

Further, a multi-layer electrode according to an embodiment of the present invention may be applied to light emitting devices, such as LEDs and LDs.

While embodiments of the present invention have been particularly shown and described with reference to exemplary embodiments thereof, it will be understood by those of ordinary skill in the art that various changes in form and details may be made therein without departing from the spirit and scope of embodiments of the present invention as defined by the following claims.

What is claimed is:

1. A multi-layer electrode of a compound semiconductor light emitting device, which is formed on a p-type compound semiconductor layer of the compound semiconductor light emitting device, the multi-layer electrode comprising:
- a first electrode layer on the p-type compound semiconductor layer which comprises a substance selected from the group consisting of a transparent conductive oxide, a non-conductive oxide, and a nitride; and
- a second electrode layer on the first electrode layer which comprises a substance selected from the group consisting of a transparent conductive oxide, a non-conductive oxide, and a nitride,
- wherein, for the first electrode layer and the second electrode layer, independently:
- the transparent conductive oxide is an oxide of at least one element selected from the group consisting of Zn, Ga, Cd, Mg, Be, Ag, Mo, V, Cu, Ir, Rh, Ru, Co, Mn and La;
- the non-conductive oxide is an oxide of at least one element selected from the group consisting of Si, Al, Zr, Ti, and Hf; and
- the nitride is a nitride of at least one element selected from the group consisting of Si, Al, Zr, Ti, and Mo.

2. A multi-layer electrode of a compound semiconductor light emitting device, which is formed on a p-type compound semiconductor layer of the compound semiconductor light emitting device, the multi-layer electrode comprising:
- a first electrode layer on the p-type compound semiconductor layer which comprises a substance selected from the group consisting of a transparent conductive oxide, a non-conductive oxide, and a nitride; and
- a second electrode layer on the first electrode layer which comprises a substance selected from the group consisting of a transparent conductive oxide, a non-conductive oxide, and a nitride, wherein each of the first electrode layer and the second electrode layer, independently, has such a thickness that it has a reflectance of 2% or less for light generated from the compound semiconductor light emitting device.

3. The multi-layer electrode of claim 1, further comprising at least one electrode layer which is on the second electrode layer and comprises a substance selected from the group consisting of a transparent conductive oxide, a non-conductive oxide, and a nitride.

4. The multi-layer electrode of claim 3, wherein, for the at least one electrode layer:
- the transparent conductive oxide is an oxide of at least one element selected from the group consisting of In, Sn, Zn, Ga, Cd, Mg, Be, Ag, Mo, V, Cu, Ir, Rh, Ru, W, Co, Ni, Mn, and La;
- the non-conductive oxide is an oxide of at least one element selected from the group consisting of Si, Al, Zr, Ti, and Hf; and
- the nitride is a nitride of at least one element selected from the group consisting of Si, Al, Zr, Ti, and Mo.

5. The multi-layer electrode of claim 4, wherein the at least one electrode layer has such a thickness that it has a reflectance of 2% or less for light generated from the compound semiconductor light emitting device.

6. The multi-layer electrode of claim 1, further comprising an ohmic contact layer which is interposed between the p-type compound semiconductor layer and the first electrode layer and comprises a substance selected from the group consisting of Ag, an Ag-based alloy, a Zn-based alloy, a Ni-based alloy, a La-based alloy, a Mg-based alloy, indium oxide containing an additive element, and $SnO_2$ containing an additive element.

7. The multi-layer electrode of claim 6, wherein the additive element comprises at least one selected from the group consisting of Mg, Ag, Zn, Sc, Hf, Zr, Te, Se, Ta, W, Nb, Cu, Si, Ni, Co, Mo, Cr, Mn, Hg, Pr, Sb, and La.

8. The multi-layer electrode of claim 7, wherein a concentration of the additive element added to at least one of the indium oxide and $SnO_2$ is 0.001-49 atomic %.

9. The multi-layer electrode of claim 6, wherein the ohmic contact layer has a thickness of 0.1-500 nm.

10. A compound semiconductor light emitting device comprising an n-type electrode, a p-type electrode, and, interposed between the n-type electrode and the p-type electrode, an n-type compound semiconductor layer, an active layer, and a p-type compound semiconductor layer,
wherein the p-type electrode comprises a multi-layer electrode in accordance with claim 1.

11. The compound semiconductor light emitting device comprising an n-type electrode, a p-type electrode, and, interposed between the n-type electrode and the p-type electrode, an n-type compound semiconductor layer, an active layer, and a p-type compound semiconductor layer, wherein the p-type electrode comprises a multi-layer electrode in accordance with claim 3.

12. The compound semiconductor light emitting device of claim 10, further comprising at least one electrode layer which is on the second electrode layer and comprises a substance selected from the group consisting of a transparent conductive oxide, a non-conductive oxide, and a nitride.

13. The compound semiconductor light emitting device of claim 12, wherein, for the at least one electrode layer:
- the transparent conductive oxide is an oxide of at least one element selected from the group consisting of In, Sn, Zn, Ga, Cd, Mg, Be, Ag, Mo, V, Cu, Ir, Rh, Ru, W, Co, Ni, Mn, and La;
- the non-conductive oxide is an oxide of at least one element selected from the group consisting of Si, Al, Zr, Ti, and Hf; and
- the nitride is a nitride of at least one element selected from the group consisting of Si, Al, Zr, Ti, and Mo.

14. The compound semiconductor light emitting device of claim 13, wherein the at least one electrode layer has such a thickness that it has a reflectance of 2% or less for light generated from the active layer.

15. The compound semiconductor light emitting device of claim 10, further comprising an ohmic contact layer which is interposed between the p-type compound semiconductor layer and the first electrode layer and comprises a substance selected from the group consisting of Ag, an Ag-based alloy, a Zn-based alloy, a Ni-based alloy, a La-based alloy, a Mg-based alloy, indium oxide containing an additive element, and $SnO_2$ containing an additive element.

16. The compound semiconductor light emitting device of claim 15, wherein the additive element comprises at least one selected from the group consisting of Mg, Ag, Zn, Sc, Hf, Zr, Te, Se, Ta, W, Nb, Cu, Si, Ni, Co, Mo, Cr, Mn, Hg, Pr, Sb, and La.

17. The compound semiconductor light emitting device of claim 16, wherein a concentration of the additive element added to at least one of the indium oxide and $SnO_2$ is 0.001-49 atomic %.

18. The compound semiconductor light emitting device of claim 15, wherein the ohmic contact layer has a thickness of 0.1-500 nm.

19. The compound semiconductor light emitting device of claim 10, wherein the n-type compound semiconductor layer comprises:
- a first compound semiconductor layer stacked on a substrate and has a stepped difference; and
- a lower clad layer stacked on the first semiconductor layer.

20. The compound semiconductor light emitting device of claim 19, wherein the first compound semiconductor layer comprises an n-GaN based III-V group nitride compound semiconductor layer.

21. The compound semiconductor light emitting device of claim 19, wherein the n-type electrode is disposed on a lower stepped portion of the first compound semiconductor layer.

22. The compound semiconductor light emitting device of claim 10, wherein the active layer comprises a GaN-based III-V group nitride compound semiconductor layer, which is represented by $In_xAl_yGa_{1-x-y}N$, wherein $0 \leq x \leq 1$, $0 \leq y \leq 1$, and $x+y \leq 1$.

23. The compound semiconductor light emitting device of claim 22, further comprises an upper wave guide layer on the active layer.

24. The compound semiconductor light emitting device of claim 22, further comprises a lower wave guide layer under the active layer.

25. The compound semiconductor light emitting device of claim 10, wherein the p-type compound semiconductor layer comprises an upper clad layer and a second compound semiconductor layer.

26. The compound semiconductor light emitting device of claim 25, wherein the upper clad layer has a lower refractive index than the active layer.

27. The compound semiconductor light emitting device of claim 25, wherein the second compound semiconductor layer comprises an ohmic contact layer.

28. The multi-layer electrode of claim 1,
wherein a thickness $d_1$ and $d_2$ of the first and second electrode layers are determined by equations $$d_1 = \left[\frac{\lambda}{2\pi n_1}\arctan(F_1)\right], \left[\frac{\lambda}{2\pi n_1}\arctan(\pi - F_1)\right],$$

$$F_1 = n_1\sqrt{\frac{(n_{sub} - n_0)(n_2^2 - n_0 n_{sub})}{(n_1^2 n_{sub} - n_0 n_2^2)(n_0 n_{sub} - n_1^2)}},$$

$$d_2 = \left[\frac{\lambda}{2\pi n_2}\arctan(\pi - F_2)\right], \left[\frac{\lambda}{2\pi n_2}\arctan(F_2)\right],$$

$$F_2 = n_2\sqrt{\frac{(n_{sub} - n_0)(n_0 n_{sub} - n_1^2)}{(n_1^2 n_{sub} - n_0 n_2^2)(n_2^2 - n_0 n_{sub})}},$$

wherein $n_0$, $n_1$, $n_2$ and $n_{sub}$ represent reflective indices of air, the first electrode layer, the second electrode layer and the p-type semiconductor layer, respectively,
wherein $\lambda$ represents a wavelength of light emitted.

* * * * *